(12) United States Patent
Guedon et al.

(10) Patent No.: US 7,589,653 B2
(45) Date of Patent: Sep. 15, 2009

(54) OUTPUT ARCHITECTURE FOR LCD PANEL COLUMN DRIVER

(75) Inventors: Yannick Guedon, Singapore (SG); Yoseph Adhi Darmawan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 12/021,426

(22) Filed: Jan. 29, 2008

(65) Prior Publication Data

US 2008/0204292 A1 Aug. 28, 2008

Related U.S. Application Data

(60) Provisional application No. 60/891,262, filed on Feb. 23, 2007.

(51) Int. Cl.
*H03M 1/66* (2006.01)
(52) U.S. Cl. ............... 341/144; 341/145; 341/146
(58) Field of Classification Search ........ 341/144–146; 455/74
See application file for complete search history.

(56) References Cited

U.S. PATENT DOCUMENTS 7,061,953 B2 * 6/2006 Robinson et al. ......... 372/38.1
7,068,978 B2 * 6/2006 Sekiguchi .................. 455/74

* cited by examiner

*Primary Examiner*—Jean B Jeanglaude
(74) *Attorney, Agent, or Firm*—Lisa K. Jorgenson; Renee Michelle Leveque

(57) ABSTRACT

A digital to analog converter (DAC) circuit operates over an upper range and a lower range. An upper voltage node is designated AVDD; a middle voltage node is designated HVDD; and a lower voltage node designated ground. An upper DAC stage has at least one NMOS transistor that produces an output to an upper range output node when the output is in the upper range. A lower DAC stage has at least one PMOS transistor that produces an output to a lower range output node when the output is in the lower range. A body bias control circuit couples the body of the upper NMOS transistor to a voltage source equal to HVDD−Vbe and connects the body of the lower PMOS transistor to voltage source equal to HVDD+Vbe.

26 Claims, 6 Drawing Sheets

OUTPUT ARCHITECTURE FOR LCD PANEL COLUMN DRIVER

CROSS-REFERENCE TO RELATED APPLICATIONS

This application claims the benefit of U.S. Provisional Patent Application Ser. No. 60/891,262 filed on 23 Feb. 2007, entitled "Output Architecture for LCD Panel Column Driver" which is hereby incorporated by reference in its entirety herein.

BACKGROUND

Dual rail LCD (Liquid Crystal Display) column drivers commonly use shield circuits (shields) to assure that the output transistors do not exceed a specified maximum voltage. As shown in FIG. 1, by way of example, such shields prevent the transistors from exceeding 8 volts (in this example using 8 volt compliance transistors).

In FIG. 1, DAC=Digital to Analog Converter; UDAC=Upper DAC 10; LDAC=Lower DAC 12; USWITCHES=Upper switches 14; LSWITCHES=Lower switches 16; USHIELD=Upper shield 18; and LSHIELD=Lower shield 20. Upper refers to upper range of the DAC circuit which normally operates between HVDD-AVDD; and Lower refers to lower range which normally operates between 0-HVDD. In the example of FIG. 1, AVDD =16 volts max, and HVDD =8 volts max. Thus, the output at the PAD or node 24 has an output voltage swing between 0 and AVDD which in this example is 16 volts.

In FIG. 1, the transistor devices used in all circuits are 8V compliance transistors. The configuration of the UDAC 10 and LDAC 12, are depicted in greater detail in FIG. 2, in which the body of NMOS transistor 22 could be coupled to the ground (0V) for the lower range. The body of the NMOS transistor 24 can be coupled to HVDD for the upper range while the body of the PMOS transistor 26 could be coupled to HVDD for the lower range and the body of the PMOS transistor 28 can be coupled to AVDD for the upper range. This is the case with the p-substrate isolated technology. In the case of the p-substrate non isolated technology, all of the NMOS' body are tied to ground. The non isolated technology will introduce the body effect and increase the on resistance of the NMOS of the upper DAC hence degrading the speed performance.

The output is taken at 30 for the upper range of the DAC (UDAC) and 32 for the lower range of the DAC (LDAC) as shown. This output is passed to USWITCHES 14 and LSWITCHES 16 respectively to produce switch outputs 34 and 36 respectively. The switches 14 and 16 respectively are switched in a manner such that the lower range is open and the upper range closed when there is a DAC output that is in the upper range, and vice versa when there is an output in the lower range from the DAC.

FIG. 1 also shows that the PAD 24 swings from 0V to AVDD while the OUTUSW and OUTLSW always swings from HVDD to AVDD and 0 to HVDD respectively. This is due to the use of the shields 18 and 20 in order to protect the 8V compliance devices, hence at any given time the voltage across any of the devices won't exceed 8V. The shields 18 and 20 are generally configured as cascode transistors with the gates around HVDD.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figures 1, 2:
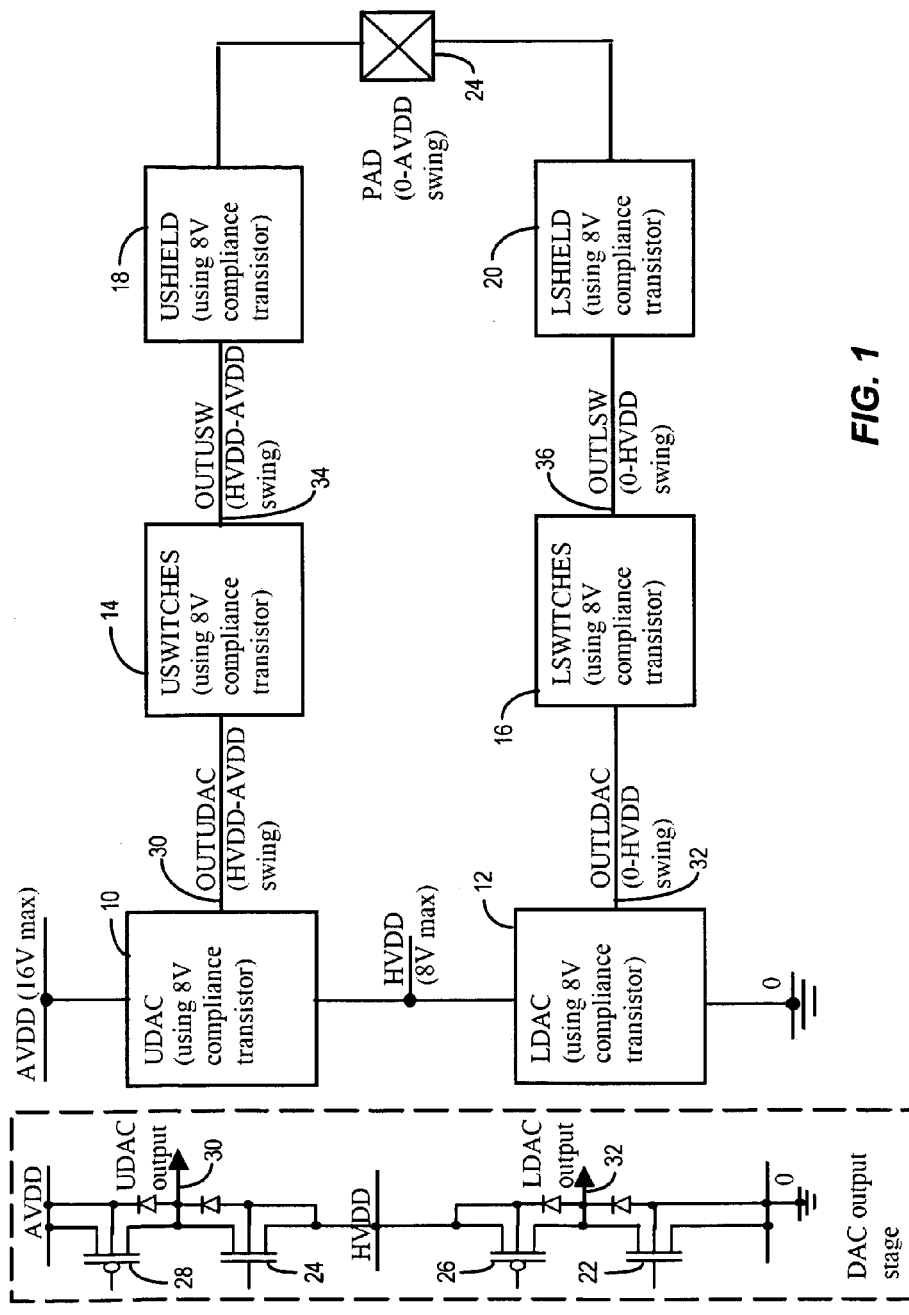
FIG. 1 is a block diagram of an LCD driver circuit.
FIG. 2 is a schematic of upper and lower DAC circuits as used in the LCD driver circuit of FIG. 1.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation. The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Again considering FIG. 1, use of the shields' 18 and 20 has the drawback of increasing the die area and power dissipation. The main advantage of this architecture is the fast speed of the DAC conversion due to use of small 8V compliance transistors.

The embodiments discussed herein relate generally to driving LCD panels. During the driving period, an LCD panel is equivalent to an RC (resistive and capacitive) load for the column driver. The capacitor in the RC load is connected to an electrode called Vcom. The voltage applied to the RC must be varied alternatively higher and lower than the Vcom in order not to damage the LCD panel. This is why LCD drivers generally provide two ranges of voltage, above and below the approximate middle point called HVDD (HVDD being close but not necessarily exactly equal to Vcom for the LCD panel. The column driver could use a single buffer with a 0-AVDD output range capability. In the field of CDAC PPDS column drivers, it is particularly interesting to have two buffers being able to drive separately the upper and lower range. The reason is that the buffer is the DAC itself and when one DAC (e.g., the lower DAC) is driving the panel, the other DAC (e.g., the upper DAC) is converting the data for the next line. After the conversion is done, the DAC (e.g., the upper DAC) is then driving the panel, in which during this time the other DAC (e.g., the lower DAC) is converting the data for the next line. Hence the upper and lower DAC take turns in converting and driving the data.

Figure 3:
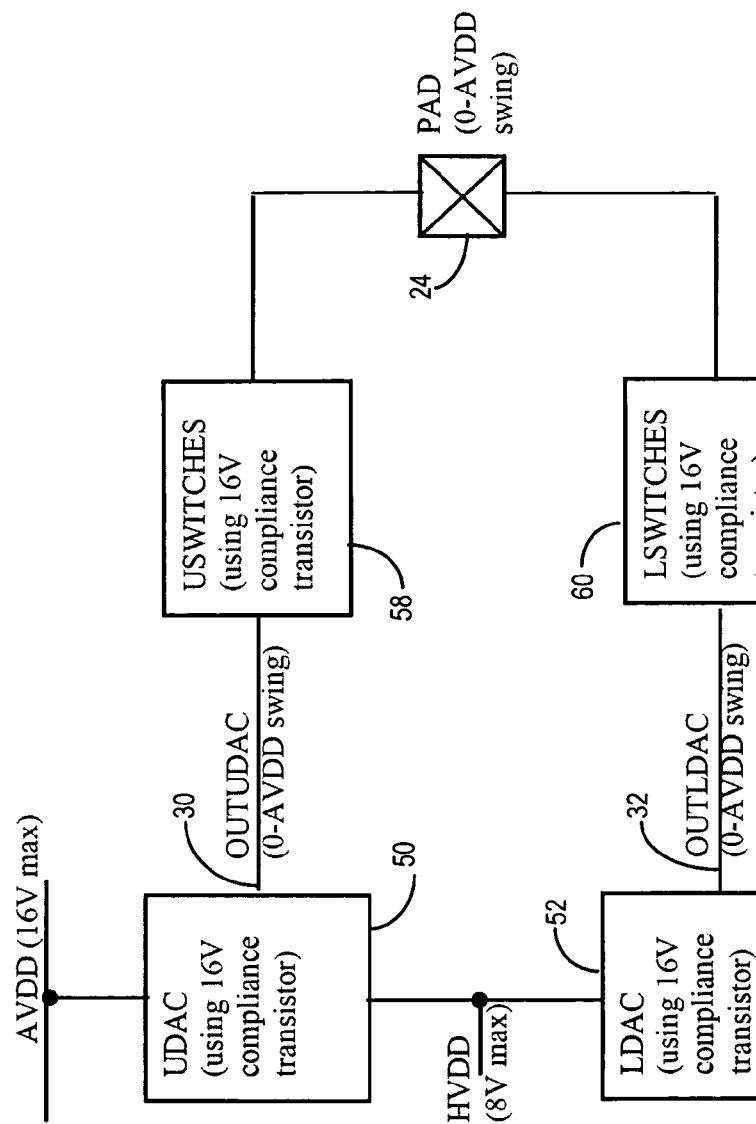
FIG. 3 is a block diagram of another LCD driver circuit.

In one embodiment, the architecture in FIG. 3 could be used to eliminate the shields shown in FIG. 1. Elimination of these shields would reduce the die area required, but the 16 volt compliance transistors used inside the DAC would increase the die area. In FIG. 3, DAC=Digital to Analog Converter; UDAC=Upper DAC 50; LDAC=Lower DAC 52; USWITCHES=Upper switches 58; and LSWITCHES=Lower switches 60. Upper refers to upper range which normally operates between HVDD-AVDD; and Lower refers to lower range which normally operates between 0-HVDD.

Figure 4:
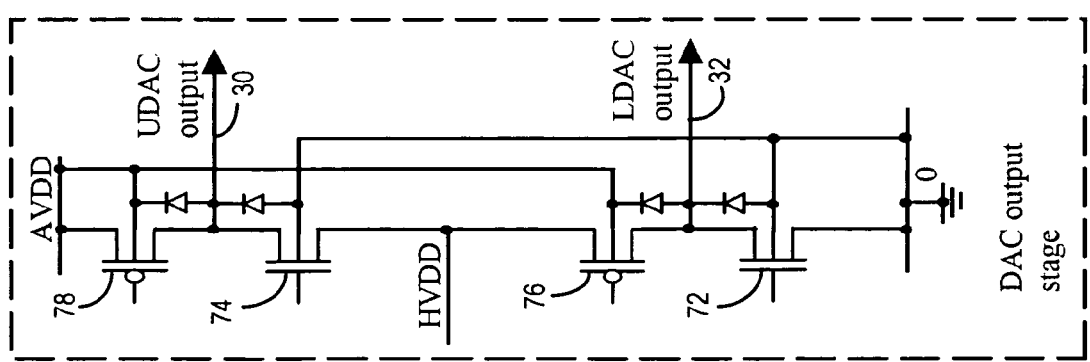
FIG. 4 is a schematic of upper and lower DAC circuits as used in the LCD driver circuit of FIG. 3.

In this embodiment of FIG. 3, there is no danger of damage to the transistors in the UDAC 50 and the LDAC 52 since they are manufactured using larger 16 volt compliance transistors and are configured as shown in FIG. 4.

In this case the OUTUDAC 30 and OUTLDAC 32 can each tolerate 0-AVDD swing due to use of the 16V compliance transistors in UDAC 50 and LDAC 52. In order to avoid turning on the intrinsic diodes of the transistors, the body of the NMOS transistors 72 and 74 are both coupled to the ground (0V) for both upper and lower DAC while the body of the PMOS transistors 76 and 78 are coupled to the AVDD for both upper and the lower DAC. In this embodiment, the size is potentially impacted due to the use of larger 16 volt compliance transistors. This would have impact on the body effect (becoming higher) hence bigger transistors are needed to achieve the same performance. The 16V compliance transistor used in the DAC would be bigger compared to the 8V one used in FIG. 1 due to process constraints. The body effect and the process constraint results in comparatively large transistor size which will affect the speed performance of the DAC. It is arguable whether the embodiments of FIG. 1 or FIG. 3 would consume more area for the same performance.

However, one advantage of the architecture in FIG. 3 is the reduction of the power dissipation thanks to the elimination of the shields. But, this architecture has the drawback of potentially slower DAC conversion speed due to the use of large 16V compliance device.

Figure 5:
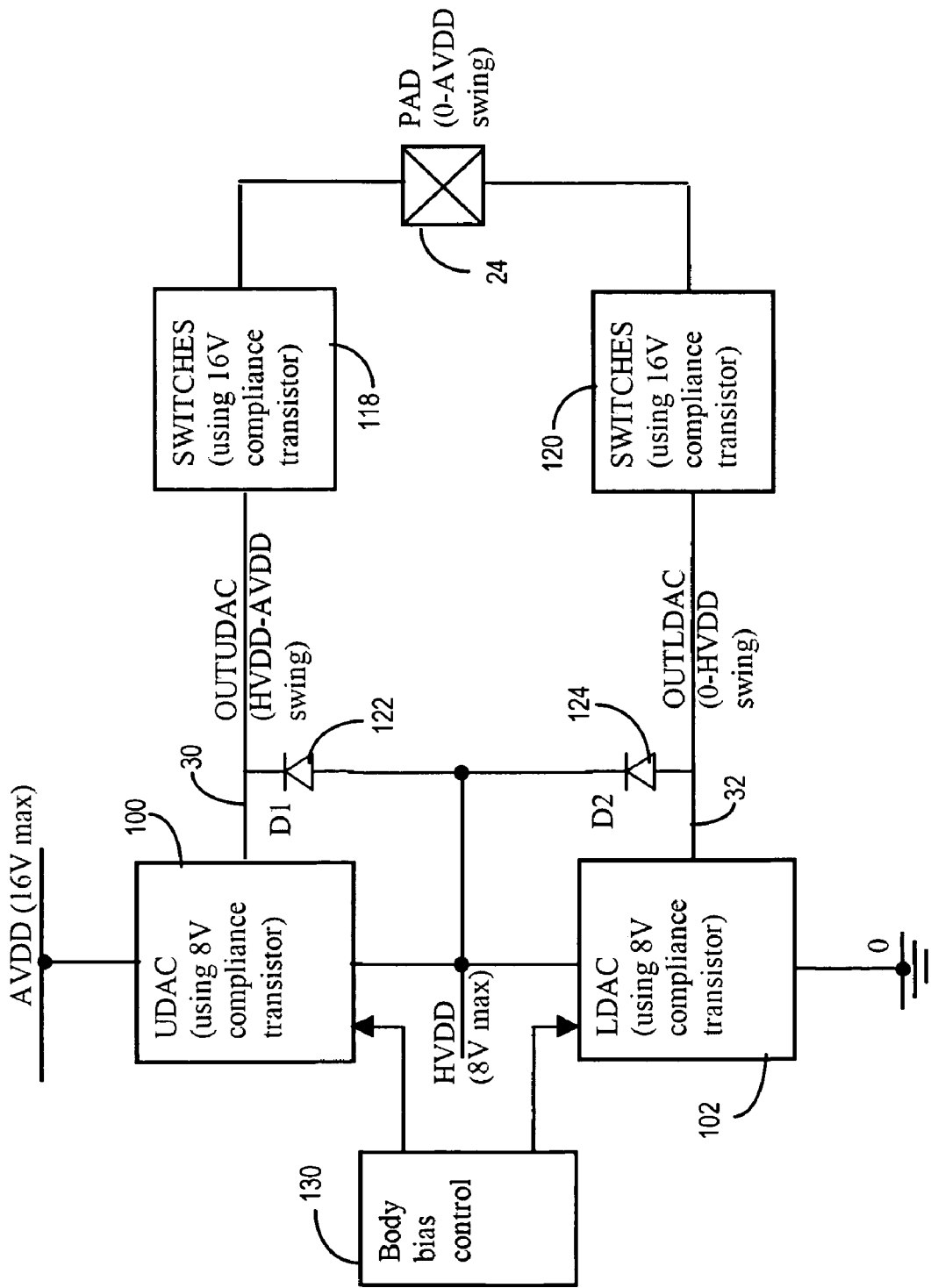
FIG. 5 is a block diagram of another LCD driver circuit as described in various representative embodiments.

The architecture in FIG. 5 can be used to eliminate the shields. In FIG. 5, DAC=Digital to Analog Converter; UDAC=Upper DAC 100; LDAC=Lower DAC 102; USWITCHES=Upper switches 118; and LSWITCHES=Lower switches 120; Upper refers to upper range which normally operates between HVDD-AVDD; and Lower refers to lower range which normally operates between 0-HVDD.

In this embodiment, the voltage applied to the body of the NMOS and the PMOS are controlled by a body bias control circuit 130. In operation, the body bias control circuit 130 connects the body of the NMOS devices of the UDAC to a voltage having a value equal to one diode threshold voltage drop below HVDD (i.e., HVDD−Vbe, where Vbe is used in the conventional sense of a transistor's base to emitter voltage drop throughout). Also, the body bias control circuit 130 connects the body of the PMOS devices of the LDAC to a voltage having a value equal to one diode threshold voltage drop above HVDD (i.e., HVDD+Vbe). The body bias control block 130 is not used to control the body of the PMOS devices of the UDAC, which is conventionally connected to AVDD; nor is the body bias control block 130 used to control the body of the NMOS devices of the LDAC which is conventionally tied to ground. Diodes D1 and D2 (122 and 124 respectively) clamp OUTUDAC 30 and OUTLDAC 32 hence keeping them in (HVDD−Vbe) to AVDD swing and 0 to (HVDD+Vbe) swing respectively. The diodes will help to protect the 8V compliance device in UDAC and LDAC from seeing the 0-AVDD swing. In addition, the diode D1 122 helps to boost the low to high transition of OUTUDAC 30 by sourcing the current from HVDD when it conducts. This is the case when there is an output transition from lower range to upper range. The diode D2 124 helps the high to low transition of OUTLDAC 32 by sinking the current to HVDD when it conducts. This could be the case when there is an output transition from upper range to lower range.

The body bias control block 130 is designed to prevent the turning on of the intrinsic body diodes of DAC's output stage, particularly the NMOS of the UDAC and the PMOS of the LDAC.

One potential advantage of the architecture of FIG. 5 is the elimination of the resistive shields 18 and 20 hence resulting in less power dissipation and smaller area for the same performance. This architecture also has a fast DAC conversion speed by virtue of use of 8V compliance transistors. The body bias control block 130 assists in ensuring a "small body effect" for all of the transistors in UDAC 100 and LDAC 102. In addition, the use of diodes 122 and 124 helps to speed up the driving transitions from upper to lower range and vice versa. The performance of the different architectures is summarized in Table 1.

TABLE 1

(The performance of the different architectures)

| | Die area | Power dissipation | DAC conversion speed | Comment |
|---|---|---|---|---|
| FIG. 1 | big | high | fast | The big die area and the high power dissipation are due to the use of shields. The fast DAC conversion speed is due to the use of small 8 V compliance transistors. |
| FIG. 3 | big | low | slow | The big die area and the slow DAC conversion speed are due to the use of large 16 V compliance transistors. The elimination of the shields results in low power dissipation. |
| FIG. 5 | small | low | fast | The fast DAC conversion speed is due to the use of small 8 V compliance transistors. The small die area and the low power dissipation are due to the elimination of the shields. |

Figure 6:
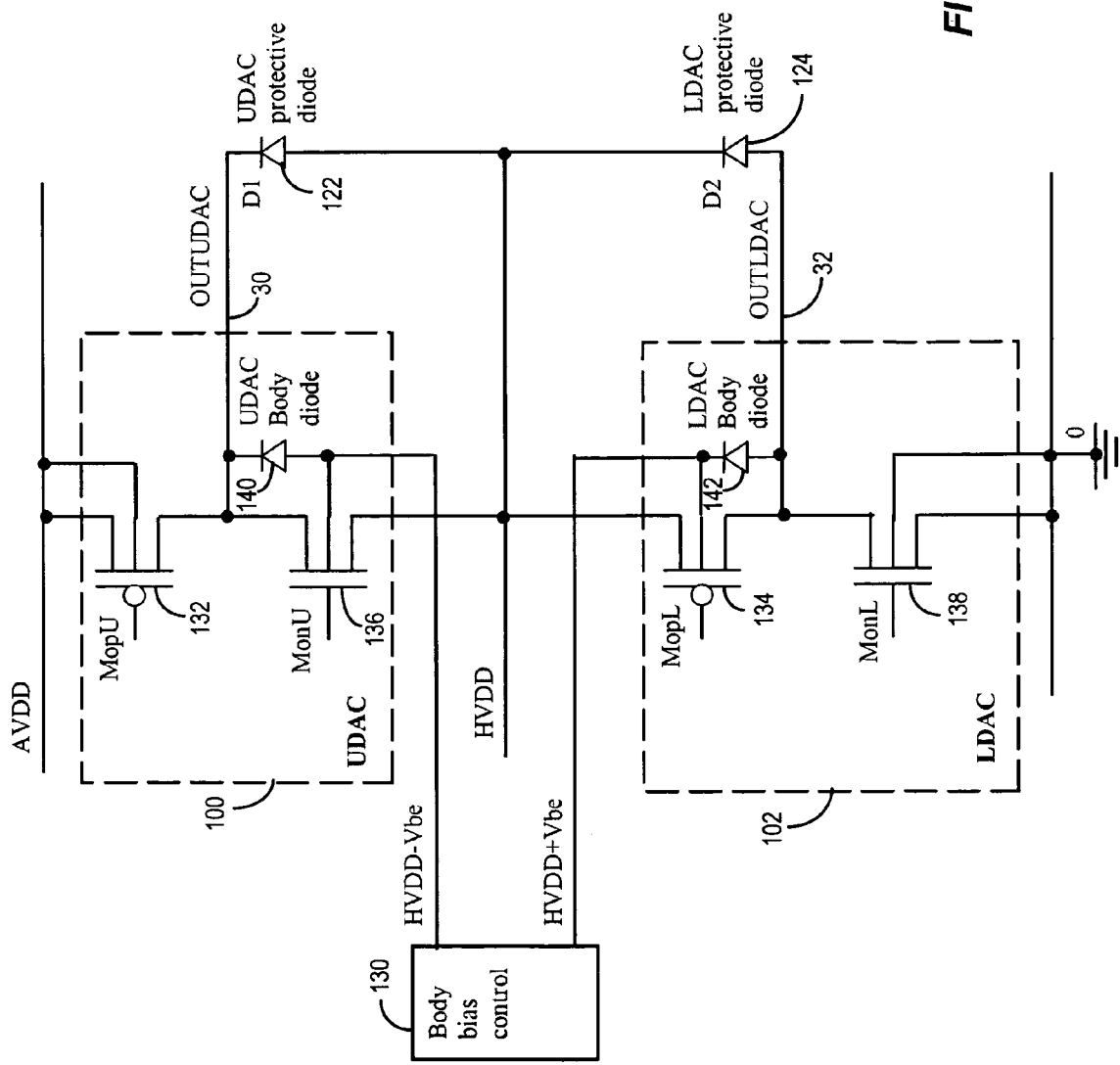
FIG. 6 is schematic diagram of an exemplary DAC circuit as used in connection with the LCD driver of FIG. 5 as described in various representative embodiments.

FIG. 6 shows the output stage of this exemplary DAC. In FIG. 6, DAC=Digital to Analog Converter; UDAC=Upper DAC 100; LDAC=Lower DAC 102; MopU 132 and MopL 134 are the output PMOS transistors of the upper and lower DAC 100 and 102 respectively; and MonU 136 and MonL 138 are the output NMOS transistors of the upper and lower DAC 100 and 102 respectively. Upper refers to upper range which normally operates between HVDD-AVDD; and Lower refers to lower range which normally operates between 0-HVDD.

In the circuit of FIG. 6, PMOS transistor 132 is coupled such that its source is coupled to AVDD, and the drain is coupled to the output OUTUDAC, and the NMOS transistor 136 is coupled such that its source is coupled to HVDD and its drain is coupled to the drain of PMOS transistor 132, and hence to OUTUDAC. The intrinsic body diode 140 is shown between the body and the drain of NMOS transistor 136. The body of transistor 132 is coupled to AVDD and the inputs are received at the gates of transistors 132 and 136. The body of transistor 136 is coupled to the body bias control which is constant and equal to HVDD−Vbe Similarly, in the LDAC 102, transistor 134 has its source coupled to HVDD and its drain coupled to OUTLDAC. Transistor 138 has its drain coupled to OUTLDAC and the drain of transistor 134. The source of transistor 138 is coupled to ground as is its body. The body of PMOS transistor 134 is coupled to the body bias control 130. Intrinsic body diode 142 is shown between the drain of PMOS transistor 134 and its body.

The body bias block 130 is used to ensure the intrinsic body diodes 140 and 142 of the upper and lower DAC 100 and 102 respectively do not turn on. The body bias block 130 is used to tie the body of the UDAC to HVDD−Vbe while the LDAC to HVDD+Vbe, hence the protective diodes will always conduct first, minimizing the risk of turning on the body diodes 140 and 142. The turning on of the body diodes would have a negative effect on the precision of the DAC conversion process.

Figure 7:
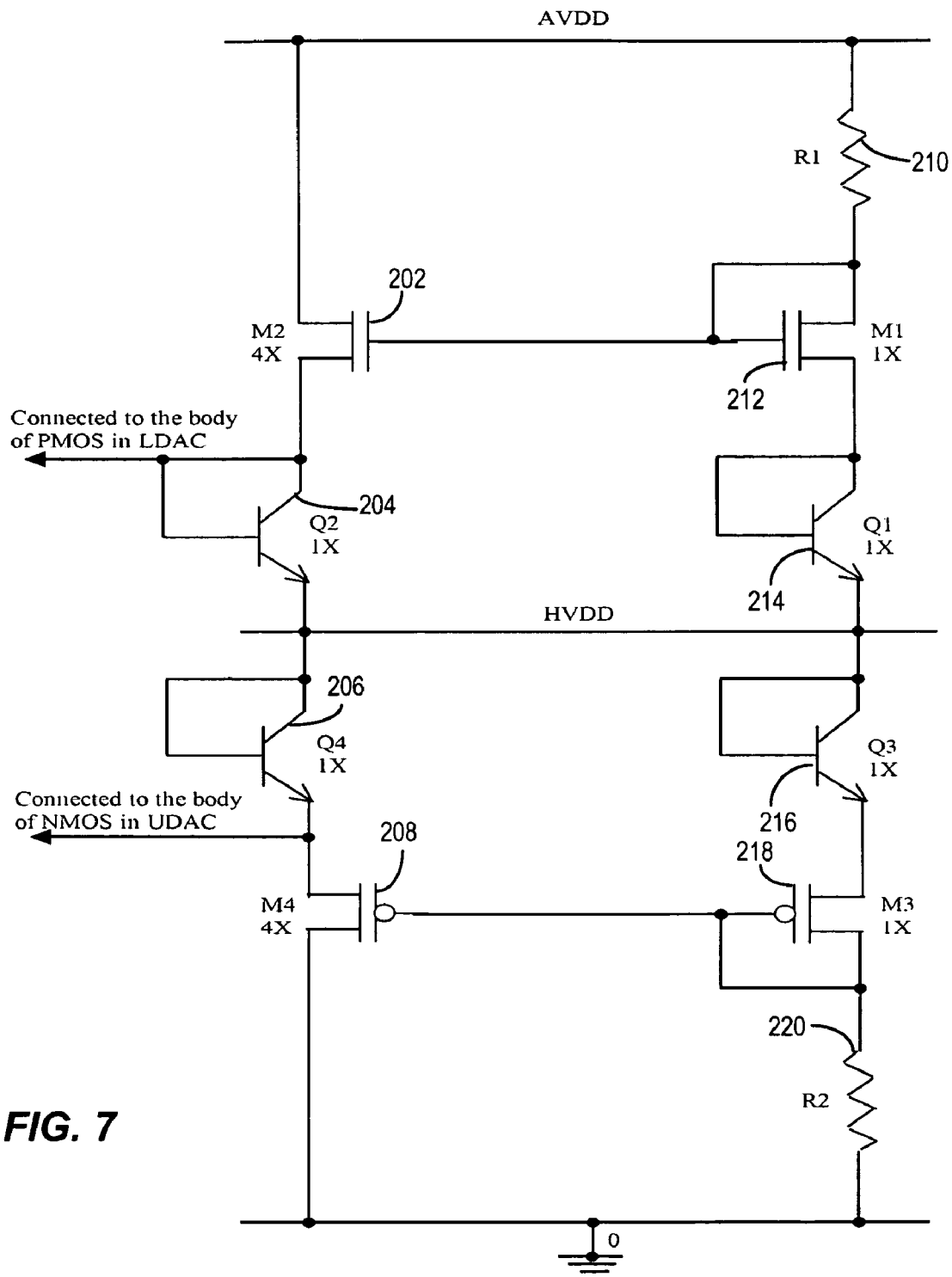
FIG. 7 is circuit diagram of one embodiment of a body bias control circuit as described in various representative embodiments.

The body bias block 130 should ideally provide two voltage sources respectively equal to HVDD+Vbe and HVDD−Vbe. An example illustrating the body bias control block 130 is shown in FIG. 7. In this exemplary circuit, the body bias control block 130 is made up of two class-AB buffers stacked on each other and operating respectively between ground and HVDD for the buffer dedicated to the UDAC, and operating between HVDD and AVDD for the buffer dedicated to the LDAC.

The two class-AB buffers are stacked so that one buffer is made up of transistors Q2, M2, Q1, M1 respectively labeled 204, 202, 214, and 212 along with resistor R1 210. The other is made up of transistors Q4, M4, Q3, M3 respectively labeled 206, 208, 216, 218 along with resistor R2 220. Transistors 202 and 208 are depicted as being 4× transistors for greater current capacity.

The body bias control block 130 is designed to prevent the turning on of the intrinsic body diodes of DAC's output stage, particularly the NMOS of the UDAC and the PMOS of the LDAC. The voltage applied to the body of the NMOS and PMOS are controlled by a body bias control circuit 130 as depicted. The body bias block 130 generates two voltages that are constant and used to bias the NMOS devices of the UDAC and the PMOS devices of the LDAC.

Of course, many variations in the body block circuit are possible that deviate from the exact circuit depicted. For example, equivalent PNP transistor arrangements or all bipolar transistor embodiments can be derived, as can circuits carrying out the function described using logic gates or other transistor configurations without departing from embodiments consistent with the present invention, so long as those operations can be carried out quickly enough to provide the required protection to the 8 volt compliance transistors.

Figure 8:
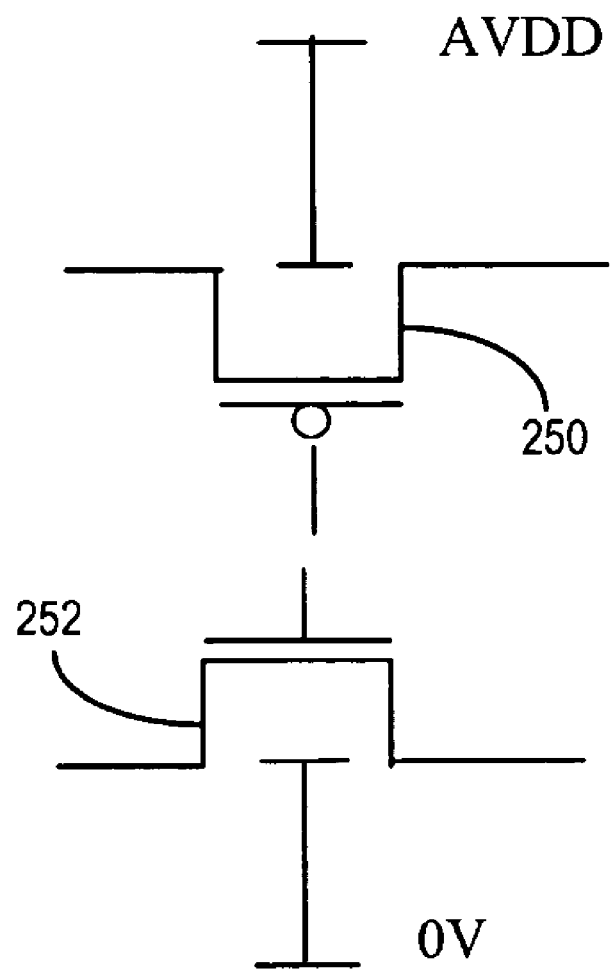
FIG. 8 is a circuit diagram of the upper and lower switches as described in various representative embodiments.

FIG. 8 depicts an embodiment of the switches. In this embodiment, USWITCH uses 16 volt compliance transistor 250 configured as a conventional PMOS switch, while LSWITCH uses 16 volt compliance transistor 252 similarly configured as an NMOS switch. The gates of transistors 250 are coupled to high voltage (0-AVDD) control logic to switch the switches on and off as needed to pass the output signal through the transistors respectively to the pad 24.

In an alternative embodiment, D1 and D2 could be replaced with MOS transistors or other switches in order to further reduce the power dissipation. In this embodiment, a first switch is coupled between HVDD and the upper range output node and a second switch is coupled between HVDD and the lower output node, and the switches switch at approximately the turn-on voltage of the intrinsic body diode forward bias voltage for the upper NMOS and lower PMOS transistors respectively.

Additionally, other switch circuits can be devised. Although the present embodiments have been depicted illustrating use of 8 volt and 16 volt compliance NMOS and PMOS devices, this device selection should be considered specific to the particular application at hand. Other device types using differing fabrication techniques can also be used to provide similar benefits. In general, the principles disclosed can be used in connection with any compliance voltage transistors which are used in a DAC circuit that operates with at least two voltage ranges in general. Moreover, the voltages described as AVDD, HVDD and ground are to be considered relative terms without regard to absolute values or earth ground or chassis ground. Thus, AVDD could be at earth or chassis grounds with the other voltages being relatively negative thereto without departing from the present invention. Additionally, although the present invention has been exemplified by a DAC circuit that is divided into upper and lower sections, no implication that there is a restriction to two sections should be implied, since similar principles can be used to extend the concept to larger numbers of sections. In such a case, upper and lower should be interpreted as being relative terms for any two of the larger number of sections.

Thus, a digital to analog converter (DAC) circuit consistent with certain embodiments that operates over an upper range and a lower range has an upper voltage node designated AVDD; a middle voltage node designated HVDD; and a lower voltage node designated ground. An upper DAC stage has an upper PMOS transistor having its source and body coupled to AVDD and having its drain coupled to the drain of an upper NMOS transistor whose source is coupled to HVDD, wherein the junction of the upper PMOS transistor and the upper NMOS transistor forms an upper range output node. A lower DAC stage has a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node. A body bias control circuit couples the body of the upper NMOS transistor to a voltage source equal to HVDD−Vbe and connects the body of the lower PMOS transistor to voltage source equal to HVDD+Vbe.

In certain embodiments, the body bias control prevents turning on of intrinsic body diodes of the upper NMOS transistor and the lower PMOS transistor. In certain embodiments, a first diode has its anode coupled to HVDD and its cathode coupled to the upper range output node and a second diode has its cathode coupled to HVDD and its anode coupled to the lower output node. In certain embodiments, a first switch is coupled between HVDD and the upper range output node and a second switch coupled between HVDD and the lower output node, wherein the switches switch at approximately the turn-on voltage of the intrinsic body diode forward bias voltage for the upper NMOS and lower PMOS transistors respectively. In certain embodiments, the first and second switch devices are realized as MOS transistor switches. In certain embodiments, an upper output switch switches the upper output node to an output node when the output is in the upper range, and a lower output switch switches the lower output node to the output node when the output is in the lower range. In certain embodiments, the upper and lower NMOS and PMOS transistors are of a specified voltage compliance, and wherein the upper and lower output switches are devised of MOS transistors operating as switches, and wherein the MOS transistors are of a voltage compliance of at least twice that of the specified voltage compliance. In certain embodiments, the specified voltage compliance is approximately 8 volts.

In another embodiment, a digital to analog converter (DAC) circuit, consistent with certain embodiments, operates over an upper range and a lower range, has an upper voltage node designated AVDD; a middle voltage node designated HVDD; and a lower voltage node designated ground. An upper DAC stage has an upper PMOS transistor having its source and body coupled to AVDD and has its drain coupled to the drain of an upper NMOS transistor whose source is coupled to HVDD, wherein the junction of the upper PMOS transistor and the upper NMOS transistor forms an upper range output node. A lower DAC stage has a lower PMOS transistor having its source coupled to HVDD and has its drain coupled to the drain of a lower NMOS transistor whose source and body are coupled to ground, wherein the junction of the lower PMOS transistor and the lower NMOS transistor forms a lower range output node. A body bias control circuit couples the body of the upper NMOS transistor to a voltage source equal to HVDD−Vbe and connects the body of the lower PMOS transistor to voltage source equal to HVDD+Vbe. A first switch device is coupled between HDDV and the upper range output node and a second switch device is coupled between HVDD and the lower output node, wherein the switches switch at approximately the turn-on voltage of the intrinsic body diode forward bias voltage for the upper NMOS and lower PMOS transistors respectively. An upper output switch switches the upper output node to an output node when the output is in the upper range; and a lower output switch switches the lower output node to the output node when the output is in the lower range.

In certain embodiments, the first and second switch devices are realized as at least one of a pair of diodes and a pair of MOS transistor switches. In certain embodiments, wherein the upper and lower NMOS and PMOS transistors are of a specified voltage compliance, and wherein the upper and lower output switches are devised of MOS transistors operating as switches, and wherein the MOS transistors are of a voltage compliance of at least twice that of the specified voltage compliance.

In another embodiment, a digital to analog converter (DAC) circuit consistent with certain embodiments, that operates over an upper range and a lower range has an upper voltage node designated AVDD; a middle voltage node designated HVDD; and a lower voltage node designated ground. An upper DAC stage has at least one NMOS transistor that produces an output to an upper range output node when the output is in the upper range. A lower DAC stage has at least one PMOS transistor that produces an output to a lower range output node when the output is in the lower range. A body bias control circuit couples the body of the upper NMOS transistor to a voltage source equal to HVDD−Vbe and connects the body of the lower PMOS transistor to voltage source equal to HVDD+Vbe.

In certain embodiments, the upper DAC stage has an upper PMOS transistor having its source and body coupled to AVDD and has its drain coupled to the drain of an upper NMOS transistor whose source is coupled to HVDD, wherein the junction of the upper PMOS transistor and the upper NMOS transistor forms an upper range output node; and the lower DAC stage has a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node. In certain embodiments, the body bias control prevents turning on of intrinsic body diodes of the upper NMOS transistor and the lower PMOS transistor. In certain embodiments, a first switch is coupled between HVDD and the upper range output node and a second switch is coupled between HVDD and the lower output node, wherein the switches switch at approximately the turn-on voltage of the intrinsic body diode forward bias voltage for the upper NMOS and lower PMOS transistors respectively. In certain embodiments, the first and second switch devices are realized as at least one of MOS transistor switches and diodes. In certain embodiments, an upper output switch switches the upper output node to an output node when the output is in the upper range, and a lower output switch switches the lower output node to the output node when the output is in the lower range. In certain embodiments, the NMOS and PMOS transistors are of a specified voltage compliance, and wherein the upper and lower output switches are devised of MOS transistors operating as switches, and wherein the MOS transistors are of a voltage compliance of at least twice that of the specified voltage compliance. In certain embodiments, the specified voltage compliance is approximately 8 volts.

In another embodiment, a digital to analog converter (DAC) circuit that operates over an upper range and a lower range has an upper voltage node designated AVDD; a middle voltage node designated HVDD; and a lower voltage node designated ground and has an upper DAC stage that has at least one transistor that produces an output to an upper range output node when the output is in the upper range. A lower DAC stage has at least one transistor that produces an output to a lower range output node when the output is in the lower range. The upper and lower DAC stages utilize transistors that require a body bias. A body bias control circuit connects the body of at least one upper transistor to a voltage source equal to HVDD−Vbe and connects the body of the at least one lower transistor to a voltage source equal to HVDD+Vbe.

In certain embodiments, a first switch is coupled between HVDD and the upper range output node and a second switch is coupled between HVDD and the lower output node, wherein the switches switch at approximately the turn-on voltage of the intrinsic body diode forward bias voltage for the at least one upper and at least one lower transistors respectively. In certain embodiments, the first and second switch devices are realized as at least one of MOS transistor switches and diodes. In certain embodiments, an upper output switch switches the upper output node to an output node when the output is in the upper range, and a lower output switch switches the lower output node to the output node when the output is in the lower range.

A digital to analog converter (DAC) circuit that operates over an upper range and a lower range has an upper voltage node designated AVDD; a middle voltage node designated HVDD; and a lower voltage node designated ground. An upper DAC stage has an upper PMOS transistor having its source and body coupled to AVDD and having its drain coupled to the drain of an upper NMOS transistor whose source is coupled to HVDD, wherein the junction of the upper PMOS transistor and the upper NMOS transistor forms an upper range output node, and wherein the body of the upper PMOS transistor is coupled to ground. A lower DAC stage has a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node, and wherein the body of the lower PMOS transistor is coupled to AVDD. The transistors are of a specified voltage compliance greater than or equal to AVDD.

In certain embodiments, the digital to analog converter circuit has an upper output switch that switches the upper output node to an output node when the output is in the upper range, and a lower output switch that switches the lower output node to the output node when the output is in the lower range. In certain embodiments, the upper and lower output switches have transistors having the specified voltage compliance.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A digital to analog converter (DAC) circuit that operates over an upper range and a lower range, comprising in combination:
    an upper voltage node designated AVDD;
    a middle voltage node designated HVDD;
    a lower voltage node designated ground;
    an upper DAC stage comprising an upper PMOS transistor having its source and body coupled to AVDD and having its drain coupled to the drain of an upper NMOS transistor whose source is coupled to HVDD, wherein the junction of the upper PMOS transistor and the upper NMOS transistor forms an upper range output node;
    a lower DAC stage comprising a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node; and
    a body bias control circuit that couples the body of the upper NMOS transistor to a voltage source equal to HVDD−Vbe and connects the body of the lower PMOS transistor to voltage source equal to HVDD+Vbe.

2. The digital to analog converter circuit according to claim 1, wherein the body bias control prevents turning on of intrinsic body diodes of the upper NMOS transistor and the lower PMOS transistor.

3. The digital to analog converter circuit according to claim 1, further comprising a first diode having its anode coupled to HVDD and its cathode coupled to the upper range output node and a second diode having its cathode coupled to HVDD and its anode coupled to the lower output node.

4. The digital to analog converter circuit according to claim 1, further comprising a first switch coupled between HVDD and the upper range output node and a second switch coupled between HVDD and the lower output node, wherein the switches switch at approximately the turn-on voltage of the intrinsic body diode forward bias voltage for the upper NMOS and lower PMOS transistors respectively.

5. The digital to analog converter circuit according to claim 4, wherein the first and second switch devices are realized as MOS transistor switches.

6. The digital to analog converter circuit according to claim 1, further comprising an upper output switch that switches the upper output node to an output node when the output is in the upper range, and a lower output switch that switches the lower output node to the output node when the output is in the lower range.

7. The digital to analog converter circuit according to claim 4, wherein the upper and lower NMOS and PMOS transistors are of a specified voltage compliance, and wherein the upper and lower output switches are devised of MOS transistors operating as switches, and wherein the MOS transistors are of a voltage compliance of at least twice that of the specified voltage compliance.

8. The digital to analog converter circuit according to claim 1, wherein the specified voltage compliance is approximately 8 volts.

9. A digital to analog converter (DAC) circuit that operates over an upper range and a lower range, comprising in combination:
    an upper voltage node designated AVDD;
    a middle voltage node designated HVDD;
    a lower voltage node designated ground;
    an upper DAC stage comprising an upper PMOS transistor having its source and body coupled to AVDD and having its drain coupled to the drain of an upper NMOS transistor whose source is coupled to HVDD, wherein the junction of the upper PMOS transistor and the upper NMOS transistor forms an upper range output node;
    a lower DAC stage comprising a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node;
    a body bias control circuit that couples the body of the upper NMOS transistor to a voltage source equal to HVDD−Vbe and connects the body of the lower PMOS transistor to voltage source equal to HVDD+Vbe, and wherein the body bias control prevents turning on of intrinsic body diodes of the upper NMOS transistor and the lower PMOS transistor;
    a first switch device coupled between HVDD and the upper range output node and a second switch device coupled between HVDD and the lower output node, wherein the switches switch at approximately the turn-on voltage of the intrinsic body diode forward bias voltage for the upper NMOS and lower PMOS transistors respectively;
    an upper output switch that switches the upper output node to an output node when the output is in the upper range; and
    a lower output switch that switches the lower output node to the output node when the output is in the lower range.

10. The digital to analog converter circuit according to claim 9, wherein the first and second switch devices are realized as at least one of a pair of diodes and a pair of MOS transistor switches.

11. The digital to analog converter circuit according to claim 9, wherein the upper and lower NMOS and PMOS transistors are of a specified voltage compliance, and wherein the upper and lower output switches are devised of MOS transistors operating as switches, and wherein the MOS transistors are of a voltage compliance of at least twice that of the specified voltage compliance.

12. A digital to analog converter (DAC) circuit that operates over an upper range and a lower range, comprising in combination:
   an upper voltage node designated AVDD;
   a middle voltage node designated HVDD;
   a lower voltage node designated ground;
   an upper DAC stage comprising at least one NMOS transistor that produces an output to an upper range output node when the output is in the upper range;
   a lower DAC stage comprising at least one PMOS transistor that produces an output to a lower range output node when the output is in the lower range; and
   a body bias control circuit that couples the body of the upper NMOS transistor to a voltage source equal to HVDD−Vbe and connects the body of the lower PMOS transistor to voltage source equal to HVDD+Vbe.

13. The digital to analog converter circuit according to claim 12, wherein:
   the upper DAC stage comprises an upper PMOS transistor having its source and body coupled to AVDD and having its drain coupled to the drain of an upper NMOS transistor whose source is coupled to HVDD, wherein the junction of the upper PMOS transistor and the upper NMOS transistor forms an upper range output node; and wherein
   the lower DAC stage comprising a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node.

14. The digital to analog converter circuit according to claim 12, wherein the body bias control prevents turning on of intrinsic body diodes of the upper NMOS transistor and the lower PMOS transistor.

15. The digital to analog converter circuit according to claim 12, further comprising a first switch coupled between HVDD and the upper range output node and a second switch coupled between HVDD and the lower output node, wherein the switches switch at approximately the turn-on voltage of the intrinsic body diode forward bias voltage for the upper NMOS and lower PMOS transistors respectively.

16. The digital to analog converter circuit according to claim 15, wherein the first and second switch devices are realized as at least one of MOS transistor switches and diodes.

17. The digital to analog converter circuit according to claim 12, further comprising an upper output switch that switches the upper output node to an output node when the output is in the upper range, and a lower output switch that switches the lower output node to the output node when the output is in the lower range.

18. The digital to analog converter circuit according to claim 17, wherein the NMOS and PMOS transistors are of a specified voltage compliance, and wherein the upper and lower output switches are devised of MOS transistors operating as switches, and wherein the MOS transistors are of a voltage compliance of at least twice that of the specified voltage compliance.

19. The digital to analog converter circuit according to claim 18, wherein the specified voltage compliance is approximately 8 volts.

20. A digital to analog converter (DAC) circuit that operates over an upper range and a lower range, comprising:
   an upper voltage node designated AVDD;
   a middle voltage node designated HVDD;
   a lower voltage node designated ground;
   an upper DAC stage comprising at least one transistor that produces an output to an upper range output node when the output is in the upper range;
   a lower DAC stage comprising at least one transistor that produces an output to a lower range output node when the output is in the lower range;
   wherein the upper and lower DAC stages utilize transistors having a body bias; and
   a body bias control circuit that connects the body of at least one upper transistor to a voltage source equal to HVDD−Vbe and connects the body of the at least one lower transistor to a voltage source equal to HVDD+Vbe.

21. The digital to analog converter circuit according to claim 20, further comprising a first switch coupled between HVDD and the upper range output node and a second switch coupled between HVDD and the lower output node, wherein the switches switch at approximately the turn-on voltage of the intrinsic body diode forward bias voltage for the upper NMOS and lower PMOS transistors respectively.

22. The digital to analog converter circuit according to claim 21, wherein the first and second switch devices are realized as at least one of MOS transistor switches and diodes.

23. The digital to analog converter circuit according to claim 20, further comprising an upper output switch that switches the upper output node to an output node when the output is in the upper range, and a lower output switch that switches the lower output node to the output node when the output is in the lower range.

24. A digital to analog converter (DAC) circuit that operates over an upper range and a lower range, comprising in combination:
   an upper voltage node designated AVDD;
   a middle voltage node designated HVDD;
   a lower voltage node designated ground;
   an upper DAC stage comprising an upper PMOS transistor having its source and body coupled to AVDD and having its drain coupled to the drain of an upper NMOS transistor whose source is coupled to HVDD, wherein the junction of the upper PMOS transistor and the upper NMOS transistor forms an upper range output node, and wherein the body of the upper PMOS transistor is coupled to ground;
   a lower DAC stage comprising a lower PMOS transistor having its source coupled to HVDD and having its drain coupled to the drain of a lower NMOS transistor whose source and body are coupled to ground, wherein the junction of the lower PMOS transistor and the lower NMOS transistor forms a lower range output node, and wherein the body of the lower PMOS transistor is coupled to AVDD; and
   wherein the transistors are of a specified voltage compliance greater than or equal to AVDD.

25. The digital to analog converter circuit according to claim 24, further comprising an upper output switch that switches the upper output node to an output node when the output is in the upper range, and a lower output switch that switches the lower output node to the output node when the output is in the lower range.

26. The digital to analog converter circuit according to claim 25, wherein the upper and lower output switches are comprised of transistors having the specified voltage compliance.

\* \* \* \* \*